United States Patent [19]

Brand et al.

[11] Patent Number: 4,878,185
[45] Date of Patent: Oct. 31, 1989

[54] DIGITAL MEASURING INSTRUMENT

[75] Inventors: Klaus-Peter Brand, Wettingen; Jürgen Kopainsky, Brugg; Fritz Wittwer, Turgi, all of Switzerland

[73] Assignee: BBC Brown Boveri AG, Baden, Switzerland

[21] Appl. No.: 113,119

[22] Filed: Oct. 27, 1987

[30] Foreign Application Priority Data

Nov. 4, 1986 [CH] Switzerland ............ 4361/86

[51] Int. Cl.⁴ ............................................. G06F 15/20
[52] U.S. Cl. .................................. 364/572; 328/167; 364/484; 364/574
[58] Field of Search ............... 324/78 R, 78 D, 78 F; 364/484, 485, 487, 572, 724, 574, 724.01, 724.06, 724.07; 328/165, 166, 167

[56] References Cited

U.S. PATENT DOCUMENTS

| | | | |
|---|---|---|---|
| 4,015,262 | 3/1977 | Etcheverry et al. | 364/724 |
| 4,175,254 | 11/1979 | Manfreda | 324/78 D |
| 4,331,882 | 5/1982 | Hingorani | 324/78 F |
| 4,488,240 | 12/1984 | Kapadia et al. | 364/724 |
| 4,695,792 | 9/1987 | Roy | 324/78 D |
| 4,730,257 | 3/1988 | Szeto | 364/484 |
| 4,737,658 | 4/1988 | Kronmuller | 364/724 |

FOREIGN PATENT DOCUMENTS

| | | |
|---|---|---|
| 0063402 | 10/1982 | European Pat. Off. |
| 3045033 | 7/1982 | Fed. Rep. of Germany |
| 3338193 | 5/1985 | Fed. Rep. of Germany |
| 3437303 | 4/1986 | Fed. Rep. of Germany |

OTHER PUBLICATIONS

Yang et al., "Digitale Drehstrom—Messeinheit", Regelungstechnische Praxis, vol. 24, No. 6, Jun. 1982, pp. 197-202.
Mints et al., "Digital Methods for Measuring Asymmetry of Three—Phase Voltage Systems", Measurement Techniques, vol. 27, No. 6, Jun. 1984, pp. 532-535.
Hermes, "Mikroprozessoren als Basis fur Steuer—und Auswertesysteme in der Automatischen Messtechnik", Technische Mitteilungen AEG—Telefunken, vol. 68, No. 6/7, 1978, pp. 291-295.
Weiler, "Terms and Methods of Signal Description and Signal Processing", Bull. SEV/VSE 72, (1982), 9, pp. 433-438.

Primary Examiner—Parshotam S. Lall
Assistant Examiner—Kevin J. Teska
Attorney, Agent, or Firm—Burns, Doane, Swecker & Mathis

[57] ABSTRACT

A digital measuring instrument which samples at discrete points in time the analog input signals emitted by a measurement transducer of an electrical supply system in a sample and hold circuit. The sampled values are digitized in an analog/digital converter and are then used to determine a system specific quantity such as, for example, the root mean square value or the system frequency. This measuring instrument is suitable for solving the essential measurement value processing tasks occurring in an electrical supply system in a simple manner and with projectable measurement accuracy. This is achieved by the fact that the digital processing unit includes a block for shifting the fundamental and harmonic frequencies to a direct current signal which is proportional to the system specific quantity and a subsequent filter arrangement with a digital low-pass filter for suppressing the frequencies deviating from the direct current signal and a digital band-stop filter for suppressing aliasing frequencies.

15 Claims, 4 Drawing Sheets

DIGITAL MEASURING INSTRUMENT

TECHNICAL FIELD

The invention is based on a digital measuring instrument for processing the analog output signals emitted by at least one sensor of an unbalanced electrical supply system containing harmonics with a sample and hold circuit which samples the analog output signals at a predetermined sampling rate and temporarily stores the sampled values of the output signals an analog/digital converter, which follows the sample and hold circuit, for digitizing the values of the output signals sampled and temporarily stored, and a digital processing unit, connected to the output of the analog/digital converter, for determining at least one system-specific quantity from the digitized values of the output signals supplied.

PRIOR ART

A digital measuring instrument of the type mentioned above is known, for example, from J. Weiler: Terms and methods of signal description and signal processing. Bull. SEV/VSE 72 (1981) 9, pages 433–438. In the known measuring instrument, analog output signals of an electric supply system, for example the current or the voltage of one system phase, are sampled at discrete points in time, the sampled values are digitized and subsequently digitally processed to form a sytem-specific quantity such as, for example, the root mean square value or the active power. Such a measuring instrument is usually designed for solving a single measurement value processing task, such as the determination of the root mean square value or the active power, in an optimized manner and does not utilized the three-phase characteristic of the electrical supply system, as a result of which the number of the measurement value processing tasks which can be solved by such a measuring instrument is considerably restricted. In addition, such a measuring instrument is only suitable for processing signals having a comparatively low content of harmonics so that special measuring instruments must be used for systems having a considerable content of harmonics. The known measuring instrument also needs an analog low-pass filter to avoid unwanted aliasing frequencies which occur during the sampling of the output signals. Such an analog low-pass filter is not only complex but it either lowers the accuracy in the pass band or increases the unwanted transmittance in the stop band.

REPRESENTATION OF THE INVENTION

The present invention achieves the object of specifying a digital measuring instrument of the type initially mentioned, which, with a simple construction and projectable measuring accuracy, is suitable for solving all important measurement value processing tasks in an electrical supply system.

The digital measuring instrument according to the invention, does not require an analog filter for avoiding aliasing frequencies, but all important measurement value processing tasks can be solved on the basis of a uniform structure, that the three-phase characteristic of the electric system is consequentially utilized and that it can be used in systems with balanced and unbalanced load and with harmonics.

BRIEF DESCRIPTION OF THE DRAWINGS

In the text which follows, the invention is explained in greater detail with the aid of a typical embodiment shown in the drawings, in which.

APPROACH TO CARRYING OUT THE INVENTION

Figure 1:
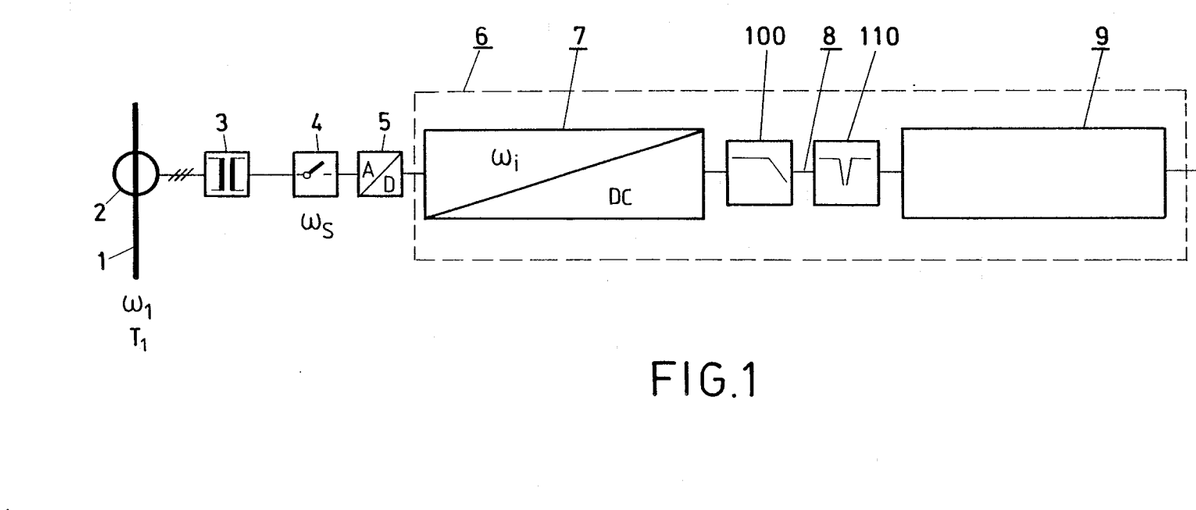
FIG. 1 shows a basic circuit diagram of a digital measuring instrument according to the invention, used in an electrical supply system.

Referring to FIG. 1, a three-phase conductor 1 of an electrical supply system conducts a three-phase current with the nominal angular frequency $\omega_1$. Values of the phase currents and/or voltages of the conductor 1 of the supply system are fed via current and voltage transformers 2 and intermediate transformers 3, provided if necessary, to the input of a sample and hold circuit 4 of the digital measuring instrument according to the invention. In the sample and hold circuit 4, the phase currents and/or voltages are sampled at a predetermined sampling rate $\omega_S$ and temporarily stored. In an analog/digital converter 5, following the sample and hold circuit 4, the values of the phase currents and/or voltages, sampled and temporarily stored, are digitized and subsequently fed to a digital processing unit 6 in which they are processed for solving the measurement value processing tasks occurring in electrical supply systems, such as the determination of the root square value, the root mean square value of the n-th harmonic and the total harmonic distortion of current and/or voltage of one phase, the active and reactive power, the frequency, the positive- and/or negative-sequence components, the ratio of imbalance and the zero-sequence component of the supply system.

The digital processing unit 6 exhibits a frequency shifting block 7 in which the values sampled by the sample and hold circuit 4 and emitted by the analog/digital converter during a period $T_1$ of the current or of the voltage of the supply system are subjected to a frequency shifting operation. During the frequency shifting, the frequencies $\omega_i$, where $i=1, \ldots, n$ of the harmonics of the supply system are shifted to form a direct current signal DC which is specific for the solution of an associated measurement value processing task. In a filter arrangement 8 following the frequency shifting block 7, interfering frequencies deviating from the mean signal DC are suppressed, the harmonics in a digital low-pass filter 100 and the aliasing frequencies formed during the sampling with the sample and hold circuit 4 in a band-stop filter 110. The frequency-shifted and filtered mean signals DC are finally processed as determined by the measurement value processing task to be solved, in a processing device 9 following the filter arrangement 8 and are subsequently output as system-specific quantity to be determined.

A measuring instrument constructed in this manner is characterized by the fact that it solves all measurement value processing tasks to be solved in an electrical supply system on the basis of a uniformly constructed digital processing unit 6 consisting of frequency shifting block 7, filter arrangement 8 and processing device 9. As will be explained below, such a digital processing unit 6 can be preferably constructed from a basic set of conventional function blocks available in program libraries. Elaborate analog antialiasing filters, which are usually the basic requirement for an accurate solution of the measurement value processing tasks in electrical systems, can be omitted. In addition, such a measuring instrument can be used both in systems with balanced loading and with unbalanced loading, with consequently utilization of the three-phase characteristic of an electrical supply system. In this context, the highest harmonic which can be evaluated is essentially only limited by the sampling rate of the sample and hold circuit 4, the band width of the signals processed and the resolution and the resolution of the analog/digital converter 5.

In this arrangement, the basic set of function blocks suitably contains at least one summing unit, a summing unit with constant-factor multiplication, a multiplier, a divider, a root extractor, an averaging unit, a PI controller, a coordinate converter, a signal generator and a function block for solving a second-order differential equation.

FIGS. 2 to 6 show circuits of the digital processing unit 6 which consist of such function blocks and which enable all measurement value processing tasks in electrical supply systems to be solved with high accuracy in a simple manner.

Figure 2:
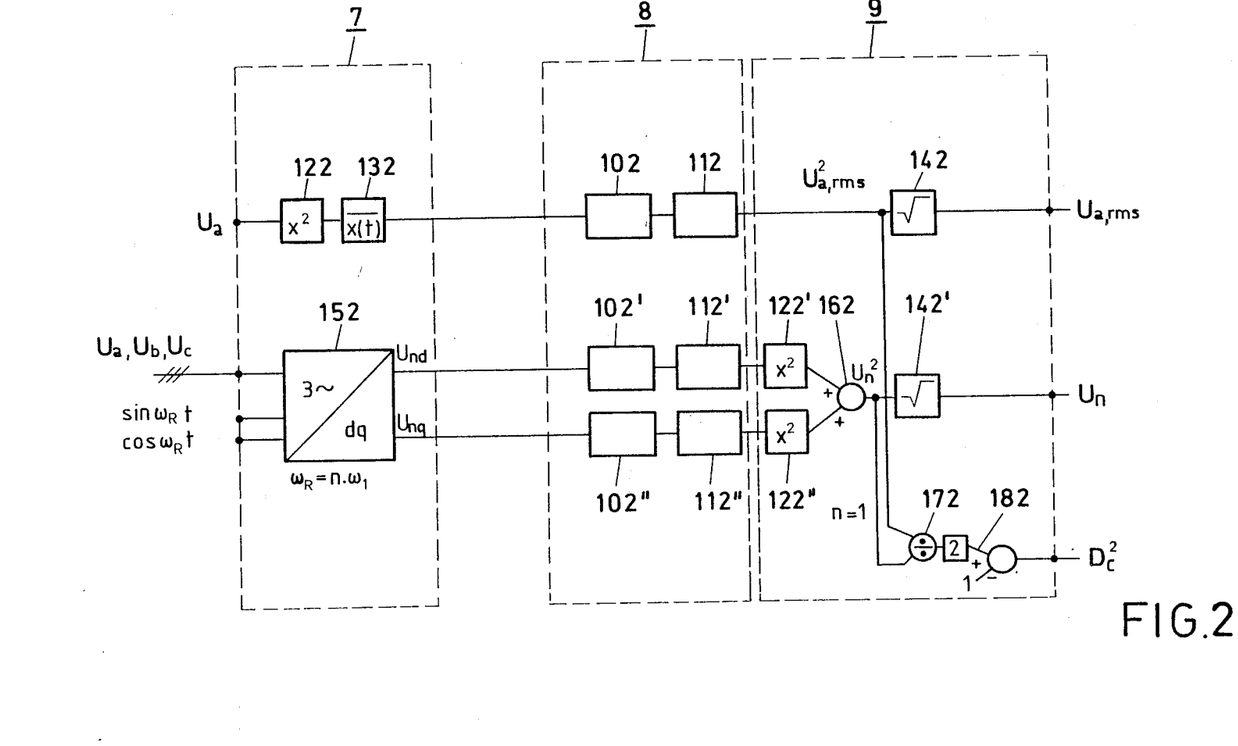
FIG. 2 shows a circuit of a digital processing unit of the measuring instrument according to FIG. 1 for determining the root mean square value, the root mean square value of the n-th harmonic and the total harmonic distortion of one phase of the supply system.

With the circuit shown in FIG. 2, the root mean square value $U_{a,rms}$ of the phase voltage $U_a$ of the supply system can be determined and, correspondingly, the root mean square value $U_n$ of the n-th harmonic and the total harmonic distortion $D_c$. This correspondingly also applies to the other phases S and T and to the phase currents.

The circuit shown contains in the frequency shifting block 7 a multiplier 122 which is constructed as squaring unit and at the input of which the digitized values of the voltage $U_a$ of the phase R of the supply system are present, and an averaging unit 132 which follows the multiplier 122 and the output of which acts via a low pass filter 102 and band-stop filter 112 of the filter arrangement 8 on the input of a root extractor 142 of the processing device 9. A signal proportional to the root mean square value of the voltage of the phase R occurs at the output of the root extractor 142.

In addition, the circuit shown in FIG. 2 also contains in the frequency shifting block 7 an RST/dq coordinate converter 152 at the inputs of which the digitized signals of the voltage, $U_a$, $U_b$, $U_c$ allocated to the three phases R, S, T of the supply system are present, and reference signals sin $\omega_R t$, with $\omega_r = n\omega_1$, where n = 1, 2, ..., which are representative of a time-variable angle $\epsilon$ between the RST system and the dq system of coordinates. A signal $U_{nd}$ occurring at the output for the direct coordinate of the RST/dq coordinate converter 152 acts via a low-pass filter 102' and a band-stop filter 112' on a multiplier 122' constructed as squaring unit. A signal $U_{nq}$ occurring at the quadratic output of the RST/dq coordinate converter 152 acts via a low-pass filter 102" and a band stop filter 112" on a multiplier 122", also constructed as squaring unit. The outputs of the two multipliers 122' and 122" are in each case connected to the input of a summing unit 162 the output of which is connected to the input of a root extractor 142' at the output of which a signal proportional to the root mean square value $U_n$ of the phase voltage occurs.

If the angle between the RST system and the dq system of coordinates is equal to $\omega_1 t$, the output of the summing unit 162 also acts on a first input of a divider 172 the second input of which is supplied with an input signal of the root extractor 142. The output of the divider 172 acts on a first input of a summing unit with constant factor multiplication 182 the second input of which is supplied with the $-1$ signal and the output of which emits a signal proportional to the square of the total harmonic distortion $D_c$.

Figure 3:
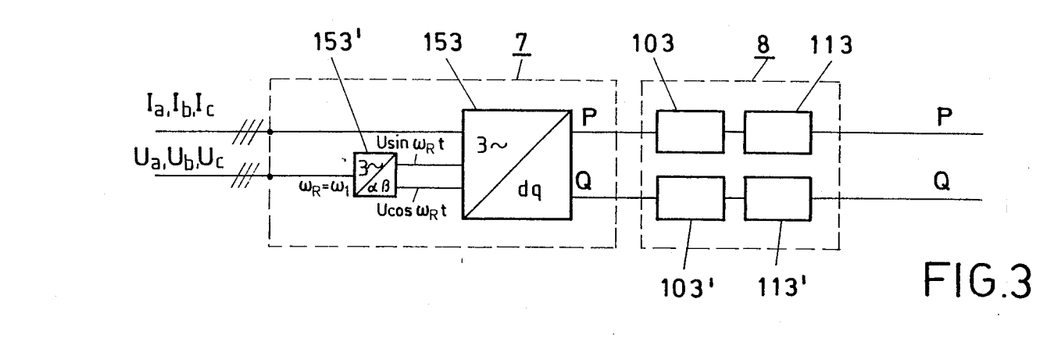
FIG. 3 shows a circuit of the digital processing unit of the measuring instrument according to FIG. 1 for determining the active and reactive power of the supply system.

The circuit shown in FIG. 3 can be used for determining the active power P and the reactive power Q of the electrical supply system in the absence of zero-sequence components. The circuit shown contains in the frequency shifting block 7 an RST/dq coordinate converter 153 at the inputs of which the digitized current values $I_a$, $I_b$ and $I_c$ allocated to the three phases R, S, T of the electrical supply system are present, and output signals Usin $\omega_R t$ and Ucos $\omega_R t$, used as reference signals, of an RST/$\alpha$, $\beta$ coordinate converter 153' at the inputs of which the voltage signals $U_a$, $U_b$, $U_c$ allocated to the three phases R, S, T of the supply system are present. The output of the RST/dq coordinate converter 153 for the direct coordinate emits, via a low-pass filter 103 and a band stop filter 113 of the filter arrangement 8, an output signal which represents the active power P. The output of the RST/dq coordinate converter 153 for the quadratic coordinate emits via a low-pass filter 103' and a band stop filter 113' an output signal which represents the reactive power Q.

Figure 4:
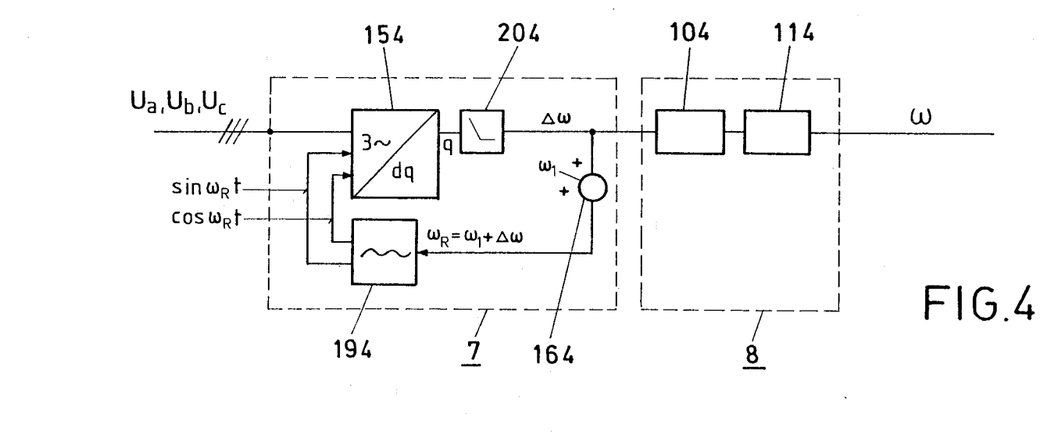
FIG. 4 shows a circuit of the digital processing unit of the measuring instrument according to FIG. 1 for determining the frequency of the supply system.

The circuit shown in FIG. 4 can be used for determining the system frequency $\omega$ of the electrical supply system. The circuit shown contains in the frequency shifting block 7 an RST/dq coordinate converter 154 at the inputs of which the digitized voltage values $U_a$, $U_b$, $U_c$ allocated to the three phases of the supply system are present and output signals sin $\omega_R t$ and cos $\omega_r t$, used as reference signals, of a signal generator 194 acting as VCO. The output q of the RST/dq coordinate converter 154, intended for the quadratic coordinate, is connected to the input of a PI controller 204 acting as loop filter. A $\Delta\omega$ signal present at the output of the PI controller 204 is connected, on the one hand, via a low-pass filter 104 and a band stop filter 114 of the filter arrangement 8 to an output of the digital measuring instrument which emits a signal proportional to the system frequency $\omega$ of the supply system and, on the other hand, to a first input of a summing unit 164 the second input of which is supplied with a signal proportional to the nominal angular frequency $\omega_1$ of the supply system and the output signal $\omega_r = \omega_1 + \Delta\omega$ of which acts on an input of the signal generator 194.

Figure 5:
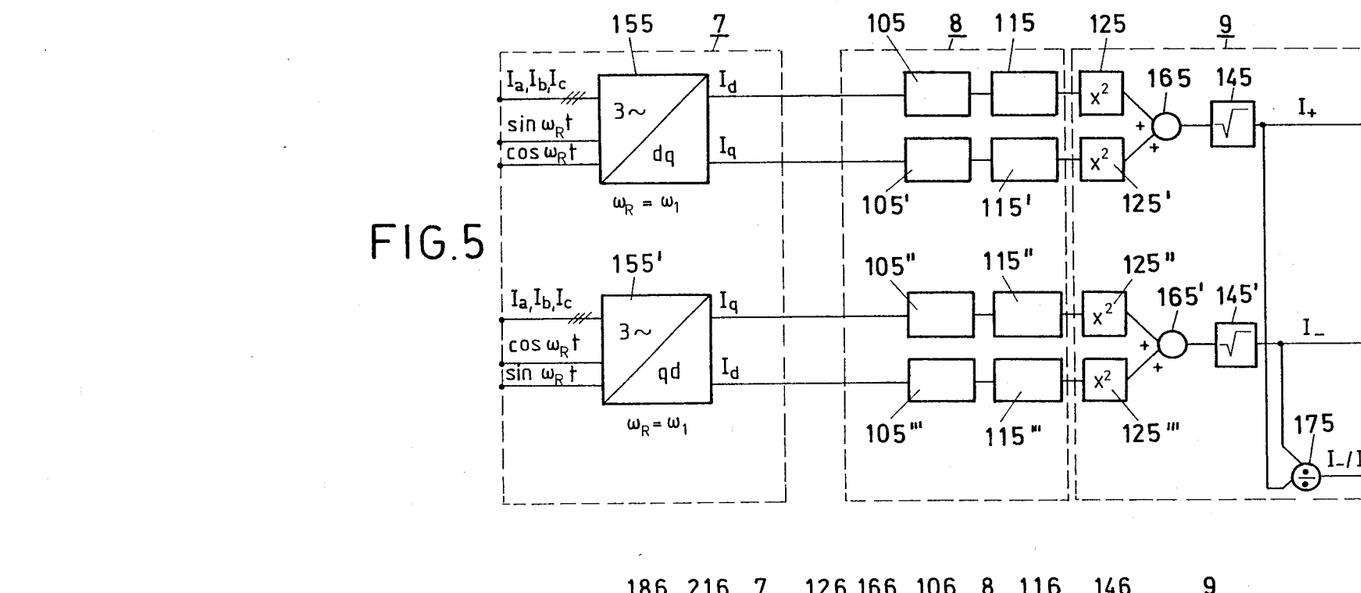
FIG. 5 shows a circuit of the digital processing unit of the measuring instrument according to FIG. 1 for determining the positive-sequence component, the negative-sequence component and the ratio of imbalance.

The circuit shown in FIG. 5 can be used for determining the positive-sequence component $I_+$, the negative-sequence component $I_-$ and the ratio of imbalance $I_-/I_+$ of the electrical supply system.

The circuit shown contains in the frequency shifting block 7 a first RST/dq coordinate converter 155 at the inputs of which the digitized current values $I_a$, $I_b$, and $I_c$ allocated to the three phases of the supply system are present and reference signals $\sin \omega_R t$ and $\cos \omega_R t$, where $\omega_R = \omega_1$, which are representative of a time-variable angle $\omega_1 t$ between the RST and the dq coordinate system. A signal present at the output of the RST/dq coordinate converter 155 for the direct coordinate and proportional to the direct current component $I_d$ acts via a low-pass filter 105 and a band stop filter 115 of the filter arrangement 8 on a multiplier 125, constructed as squaring circuit, of the processing device 9. The output of the multiplier 125 is connected to a first input of a summing unit 165. A signal present at the output of the RST/dq coordinate converter 155 for the quadratic coordinate and proportional to the quadratic current component $I_q$ acts via a low-pass filter 105' and a band-stop filter 115' of the filter arrangement 8 on a multiplier 125', constructed as squaring unit, of the processing device 9. The output of the multiplier 125' is connected to the second input of the summing unit 165. At the output of the summing unit 165, a signal occurs which is proportional to the square of the positive-sequence component $I_+$ from which the root is extracted in a subsequent root extractor 145 of the processing device 9.

In the frequency shifting block 7, an RST/qd coordinate converter 155' is also provided at the inputs of which, in correspondence with the RST/dq coordinate converter 155, the signals $I_a$, $I_b$, $I_c$ are present, and reference signals $\sin \omega_R t$ and $\cos \omega_R t$. A signal present at the output of the RST/qd coordinate converter 155' for the quadratic coordinate and proportional to the quadratic current component $I_q$ acts via a low-pass filter 105'' and a band stop filter 115'' of the filter arrangement 8 on a multiplier 125'', constructed as squaring unit, of the processing device 9. The output of the multiplier 125'' is connected to a first input of a summing unit 165'. A signal present at the output of the RST/qd coordinate converter 155' for the direct coordinate and proportional to the direct current component $I_d$ acts via a low pass filter 105''' and a band-stop filter 115''' of the filter arrangement 8 on a multiplier 125''' constructed as squaring unit. The output of the multiplier 125''40 is connected to the second input of the summing unit 165'. At the output of the summing unit 165', a signal proportional to the square of the negative-sequence component $I_-$ occurs from which the root is extracted in a subsequent root extractor 145' of the processing unit 9.

To determine the ratio of $I_{31}/I_+$ imbalance, the circuit according to FIG. 5 exhibits a divider 175 the input of which is connected to the outputs of the root extractors 145 and 145'.

Figure 6:
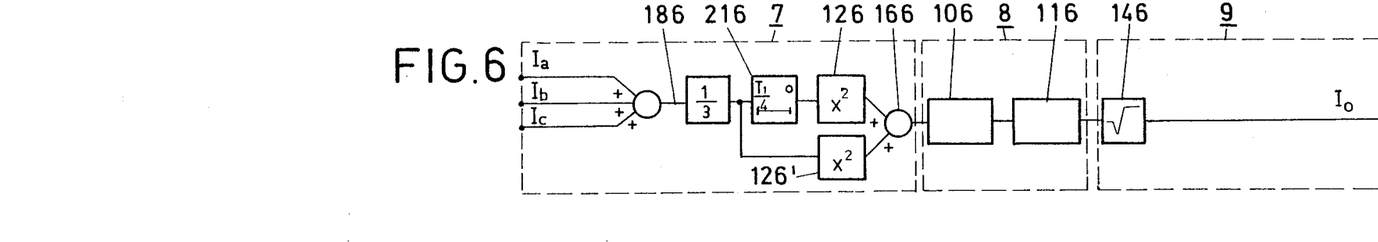
FIG. 6 shows a circuit of the digital processing unit of the measuring instrument according to FIG. 1 for determining the zero-sequence component.

The circuit shown in FIG. 6 contains in the frequency shifting block 7 a circuit arrangement which is formed by a summing unit with constant factor multiplication 186, two multipliers 126 and 126' constructed in each case as squaring units, a delay section 216 having a time delay of ¼ of the period $T_1$ of the supply system, and a summing unit 166. In this circuit, the digital signals proportional to the phase currents $I_a$, $I_b$ and $I_c$ are present at the inputs of the summing unit with constant factor multiplication 186. The output of the summing unit with constant factor multiplication 186 is connected, on the one hand, via the multiplier 126' to a first input of the summing unit 166 and, on the other hand, via the delay section 216 and the multiplier 126 following the delay section 216 to a second input of the summing unit 166. The output of the summing unit 166 acts via a low-pass filter 106 and a band stop filter 116 of the filter arrangement 8 on a root extractor 146 which is provided in the processing device 9 and at the output of which a signal proportional to the zero-sequence component $I_0$ is present.

The low-pass filters 100, 102, 102', 102'', 103, 103', 104, 105, 105', 105'', 105''', and 106, band stop filters 110, 112, 112', 112'', 113, 113', 114, 115, 115', 115'', 115''' and 116 and the delay section 216, provided in the above circuits, exhibit in each case a function block calculating the differential equation $$G(z) = \frac{a_0 + a_1 z^{-1} + a_2 z^{-2}}{1 + b_1 z^{-1} + b_2 z^{-2}}$$

Such a function block exhibits inputs for inputting the coefficients $a_0$, $a_1$, $a_2$, $b_1$ and $b_2$ and an input quantity $i(k)$, $k = 1, 2, \ldots$ measured at discrete times $1, 2, \ldots$.

This function block determines an output quantity $o(k)$ at time k in accordance with the following equation:

$$o(k) = -b_1 o(k-1) - b_2 o(k-2) + a_0 i(k) + a_1 i(k-1) + a_2 i(k-2)$$

where $o(k-1)$ and $i(k-1)$ are the values of zero and i determined at time $k-1$ and $o(k-2)$ and $i(k-2)$ are the values of zero and i determined at time $k-2$.

Depending on the choice of input quantity, such a function block can be programmed in accordance with the requirements made on it.

For the low-pass filters, a z transformation is used and $z^{-1}$ is set to equal $\exp(-sT_s)$.

The following values are entered for the coefficients:

$$a_0 = 0$$
$$a_1 = \omega_0 T_s \sqrt{2^1} \exp(-\omega_0 T_s / \sqrt{2^1}) \cdot \sin(\omega_0 T_s / \sqrt{2^1})$$
$$a_2 = 0$$
$$b_1 = -2 \exp(-\omega_0 T_s) \cdot \cos(\omega_0 T_s / \sqrt{2^1}), \text{ and}$$
$$b_2 = \exp(-\omega_0 T_s \sqrt{2^1}).$$

$T_s$ is the sampling period of the sample and hold circuit 4 and s is the variable of the transfer function $$H(s) = \frac{1}{1 + 2\xi s/\omega_0 + (s/\omega_0)2}$$
$$= \frac{1}{s + \frac{\omega_0}{\sqrt{2^1}}(1-j)} + \frac{1}{s + \frac{\omega_0}{\sqrt{2^1}}(1+j)}$$

of a second-order low-pass filter with an attenuation coefficient $\epsilon = 1/\sqrt{2}$ and a cut-off frequency $\omega_o$.

Such low pass filters suppress the frequencies deviating from the direct current signal DC such as the harmonics $\omega_i$ with $i = 1, 2, \ldots$ For the band stop filters, a bilinear z transformation is used $$s = \frac{2}{T_s} \cdot \frac{1 - z^{-1}}{1 + z^{-1}}$$

The following values are entered for the coefficients:

$$a_0 = a_2 = \frac{1 + 4(T_{br}+T_s)^2}{1 + 4\xi T_{br}/T_s + 4(T_{br}/T_s)^2}$$

$$a_1 = b_1 = 2\frac{1 - 4(T_{br}/T_s)^2}{1 + 4\xi T_{br}/T_s + 4(T_{br}/T_s)^2}$$

$$b_2 = \frac{1 - 4\xi T_{br}/T_s + 4(T_{br}/T_s)^2}{1 + 4\xi T_{br}/T_s + 4(T_{br}/T_s)^2}$$

where $T_s$ is the sampling period of the sample and hold circuit with the sampling rate $\omega_s$, $T_{br} = 2\pi/\Delta\omega = 2\pi(k\omega_1 - \omega_s)$ with $k = \pm1, \pm2, \ldots$ and s is the variable of the transfer function.

$$H(s) = \frac{1 + (s/\Delta\omega)^2}{1 + 2\xi s/\Delta\omega + (s/\Delta\omega)^2}$$

of a second-order filter with the attenuation coefficient $\xi$. Such band stop filters suppress the lowest aliasing frequency which generally exhibits the highest amplitude.

Correspondingly, the multipliers 122, 122', 122", 126 and 126' are also in each case formed from a function block of a conventional type. This correspondingly also applies to the averaging unit 132, the root extractors 142, 142', 145, 145' and 146, the summing units 162, 164, 165, 165' and 166, the dividers 172 and 175, the summing units with constant factor multiplication 182 and 186, the signal generator 194 and the PI controller 204.

The RST/dq or $\alpha\beta$ coordinate converters 152, 153, 153', 154 and 155 and the RST/qd coordinate converters 155' are in each case formed of a function block which transforms the R,S,T values of a three-phase system into corresponding values in the orthogonal d,q or in the $\alpha,\beta$ coordinate system. The angle $\epsilon$ between the two coordinate systems in this arrangement is, at the same time, defined in such a manner that the values of the R,S,T coordinates are transformed into corresponding values in the orthogonal $\alpha$, $\beta$ coordinate system. In this case, the $\alpha$ coordinate coincides with the R coordinate and the following system of equations applies to the transformation:

$$\alpha = R$$
$$\beta = (1/\sqrt{3})S - (1/\sqrt{3})T$$
$$d = d\cos\epsilon + \beta\sin\epsilon$$
$$q = d\sin\epsilon + \beta\cos\epsilon$$

The values of the coordinates R (and thus also $\alpha$, S,T and sin $\epsilon$ and cos $\epsilon$ are entered into the function block. The function block then determines the corresponding values in the $\alpha,\beta$, or dq coordinates. If the R,S,T coordinate system rotates, the $\alpha,\beta$ system also rotates whereas the dq coordinate system is stationary with a suitable input of the angle $\epsilon$ (namely as sine and cosine) and supplies a direct-current signal.

The transformation of R,S,T coordinates into a $\alpha,\beta$ or dq coordinates is a conventional technique in electrical engineering and known, for example, from the Pocket Book of Electrical Engineering, Volume 2, High Power Engineering, E. Philippow, VEB-Verlag Technik, Berlin, 1966, and particularly pages 54–60.

The measuring instrument according to the invention operates as follows:

The digital values, measured and temporarily stored by the sample and hold circuit 4 during a period $T_1$ of the supply system, of the current and/or the voltage of one or several phases of the conductor 1 of the supply system are shifted in the frequency shifting block 7 from a signal exhibiting harmonic oscillations of the frequencies $\omega_i$, $i = 1, 2, \ldots$, to a direct-current signal DC which is proportional to the required system-specific quantity. As can be seen from the circuits of FIG. 2 to 6, the frequency shifting block 7 exhibits a specific configuration for each measurement value processing task. Harmonic frequencies deviating from zero are held back by the low-pass filter 100 of the filter arrangement 8 and interfering aliasing frequencies produced by sampling with the sample and hold circuit 4 are held back by the band stop filter 110 of the filter arrangement 8. The filtered direct-current signal DC is subsequently finally processed in the processing device 9 in accordance with the measurement value processing task to be solved, enlisting the aid of the four basic types of arithmetic and of extracting roots, to form the required system-specific quantity.

In the circuit according to FIG. 2, the shifting of the signal processed in the frequency shifting block to the direct-current signal in the determination of the root mean square value of phase current or phase voltage is produced by the fact that the following identity applies to each harmonic $\cos(k\omega_1 + \phi_k)$, $k = 1, 2, \ldots$, for the fundamental frequency $\omega_1$ of the supply system:

$$\cos^2(\omega_1 t + \phi_k) = \tfrac{1}{2} - \cos 2(k\omega_1 t + \phi_k) =$$
$$DC - \cos 2(k\omega_1 t + \phi_k)$$

where $k = 1, 2, \ldots$ and $\phi_k$ is the phase angle.

Thus, each harmonic is split into a direct current signal DC and a signal having twice the frequency. Since the root mean square value, for example of the voltage of phase R, is defined as follows:

$$U_{a,rms}^2 = \lim_{T\to\infty} \frac{1}{T} \int_{-T/2}^{T/2} U_a(t)dt,$$

the periodic terms $2k\omega_1$ and the products between the harmonics of different order disappear during the integration over a period $T_1$ of the supply system. A frequency shifting to the direct current signal can therefore be achieved in a simple manner by squaring the values of the input signal measured during a period $T_1$ of the supply system and supplied to the frequency shifting block 7 and by subsequent forming of the mean of the squared values.

During the determination of the root mean square value of the n-th harmonic, direct current signals for the direct and the quadratic component of the n-th harmonic are achieved transformation of the R,S,T coordinate system into the dq coordinate system. Thus, direct voltage signals $U_{nd}$ and $U_{nq}$, which supply the required root mean square value in a simple manner after filtering, squaring, summing and root extraction, are obtained for the phase voltage $U_a$ at the outputs of the R,S,T/dq coordinate converter 152.

$$U_n = \sqrt{U_{cn}^2 + U_{sn}^2} = \sqrt{U_{nd}^2 + U_{nq}^2}$$

with $$U_{cn} = \lim_{T \to \infty} \frac{1}{T} \int_{-T/2}^{T/2} U_a(t) \cos n\omega_1 t \, dt \text{ and}$$

$$U_{sn} = \lim_{T \to \infty} \frac{1}{T} \int_{-T/2}^{T/2} U_a(t) \sin n\omega_1 t \, dt.$$

In the circuit according to FIG. 3, the shifting of the signal processed in the frequency shifting block 7 to the direct current signal during the determination of the active power P and of the reactive power Q of the electrical supply system is also obtained by R,S,T/dq transformation in which the current and voltage values of the phases R,S,T measured at the system frequency $\omega$ are considered in a reference coordinate system which rotates with the nominal angular frequency $\omega_1$ of the supply system. During this process, a $\omega$ component is split into a $(\omega-\omega_1)$ and $(\omega+\omega_1)$ component so that a direct current signal is produced for $\omega=\omega_1$. In the circuit according to FIG. 3, the voltages $U_a$, $U_b$, and $U_c$ allocated to the three phase R,S,T are then initially converted into reference signals $U\sin\omega_1 t$ and $U\cos\omega_1 t$ in the $\alpha,\beta$ reference coordinate system rotating with the nominal angular frequency $\omega_1$. By entering the three phase currents $I_a$, $I_b$ and $I_c$ and these reference signals into the R,S,T/dq coordinate converter 153, unfiltered signals proportional to the active power T are finally obtained for $\omega=\omega_R=\omega_1$ at the output of 153 for the direct coordinate and unfiltered signals proportional to the reactive power Q are finally obtained at the output of 153 for the quadratic components.

In the circuit according to FIG. 4, the shifting of the signal processed in the frequency shifting block 7 to the direct-current signal in the determination of the system frequency $\omega$ of the supply system is obtained by the fact that during an R,S,T/dq transformation in the coordinate converter 154 a quadratic component q is obtained from the voltage signals $U_a$, $U_b$, $U_c$ which is proportional to the phase angle difference $\Delta\phi$ between the measured signal and the signal of a reference signal which rotates with the frequency $\omega_R = \omega_1 + \Delta\omega$:

$$q = A\sin\Delta\phi \approx A\Delta\phi.$$

This value Q contains a direct-current signal. This direct current signal is used for controlling a phase-locked loop, PLL. The R,S,T/dq coordinate converter 154 acts as phase detector in this phase-locked loop. The signal q present at the output of the phase detector for the quadratic component is supplied to the PI controller 204 acting as filter of the PLL. The difference $\Delta\omega$ between the actual frequency and the nominal angular frequency $\omega_1$ is present at the output of the PI controller 204. After addition of the nominal angular frequency $\omega_1$ to the output signal $\omega$ of the PI controller 204, the signal $\omega_R = \omega_1 + \Delta\omega$ formed during this process reaches the signal generator 194 acting as voltage-controlled oscillator, VCO, of the phase-locked loop PLL. The output signals $\sin\omega_R t$ and $\cos\omega_R t$ of the signal generator 194 are fed as reference signals to the R,S,T/dq coordinate converter 154.

In the circuit according to FIG. 5, the shifting of the signal processed in the frequency shifting block 7 to the direct-current signal during the determination of the positive-sequence component $I_+$ is obtained by the transformation of an R,S,T/dq coordinate converter 155. This is because, in this arrangement, the following values are obtained for the direct component $I_d$ and the quadratic component $I_q$:

$$I_d = I_+\cos\phi_+ + I_-\cos(\phi_- + 2\omega_1 t)$$

$$I_q = I_+\sin\phi_+ - I_-\sin(\phi_- + 2\omega_1 t).$$

$I_d$ $I_q$ therefore in each case exhibit a direct-current component and an alternating-current component of frequency $2\omega_1$ which can be subsequently removed in the filter arrangement 8.

During the coordinate transformation by the R,S,T/qd converter 155', signals $I_q$ and $I_d$ are obtained which only contain a direct-current component which is dependent on the negative-sequence component $I_-$.

In the circuit according to FIG. 6, the shifting of the signal processed in the frequency shifting block 7 to the direct current signal during the determination of the zero-sequence component $$I_o = \tfrac{1}{3}(I_a + I_b + I_c)$$

is obtained by reproducing the identity, supplying a direct-current signal, $$i_0^2(t) + i_0^2(t + T_1/4) =$$

$$I_0^2 \left[ \cos^2(\omega_1 t + \phi_1) + \cos^2\left(\omega_1 t + \phi_1 + \frac{\pi}{2}\right)\right] = I_0^2,$$

in a circuit containing the delay section 216, the two multipliers 126 and 126' and the summing unit 166.

What is claimed is:

1. A digital measuring instrument for processing analog output signals emitted by at least one sensor of an electrical supply system containing harmonics, said digital measuring instrument comprising:
   a sample and hold circuit for sampling the analog output signals at a predetermined sampling rate and temporarily storing the sampled values,
   an analog/digital converter which follows the sample and hold circuit, for digitizing the sampled and temporarily stored values of the output signals, and
   a digital processing unit, which is connected to the output of the analog/digital converter, for determining at least one system-specific quantity from the digitized values of the output signals supplied,
   wherein the digital processing unit includes at least one block for shifting frequencies ($\omega_1$, $\omega_I$) of a fundamental wave and harmonics of the supply system to a direct-current signal which is proportional to at least one system-specific quantity, and at least one filter arrangement, which follows the at least one frequency shifting block, with a least one digital low-pass filter for suppressing the harmonic frequencies deviating from said direct current signal and with at least one digital band stop filter for suppressing aliasing frequencies.

2. A digital measuring instrument as claimed in claim 1, wherein the frequency shifting block and the filter arrangement contain in each case at least one programmable function block of a basic set of mutually independent programmable function blocks.

3. A digital measuring instrument as claimed in claim 2, wherein the digital processing unit includes a device, following the at least one filter arrangement and containing at least one of the function blocks, for processing the output signal emitted by the at least one filter arrangement.

4. A digital measuring instrument as claimed in claim 2, wherein the basic set contains at least one element selected from the group including a summing unit, a summing unit with constant factor multiplication, a multiplier, a divider, a root extractor, an averaging unit, a PI controller, a coordinate converter, a signal generator and a function block for calculating a second-order differential equation.

5. A digital measuring instrument as claimed in claim 4, wherein the at least one low-pass filter and the at least one band stop filter are in each case formed by the function block calculating a second order differential equation.

6. A digital measuring instrument as claimed in claim 4, wherein, for determining a root mean square value of an n-th harmonic of the current or of a voltage of a phase of the supply system, the frequency shifting block is formed by an R,S,T/dq coordinate converter at the inputs of which the digitized signals of the voltage allocated to the respective phases of a three-phase supply system are present and signals allocated to a sine and a cosine of an angle between an R,S,T coordinate system and a dq coordinate system rotating with n-times a nominal angular frequency ($_1$) of the supply system, and the output of which for a direct coordinate acts via a first low-pass filter and a first band stop filter of the filter arrangement on a first multiplier constructed as a squaring unit and the output of which for a quadratic coordinate acts via a second low-pass filter and a second band stop filter of the filter arrangement on a second multiplier constructed as a squaring unit, and the outputs of the first and of the second multiplier are in each case connected to an input of a summing unit, the output of which is connected to the input of a root extractor.

7. A digital measuring instrument as claimed in claim 4, wherein, for determining active power (P) and reactive power (Q) of a three-phase supply system without zero-sequence components, the frequency shifting block is formed by an R,S,T/dq coordinate converter at the inputs of which digitized current signals from said analog/digital converter allocated to the three phases of the supply system are present and output signals of an R,S,T,$\alpha,\beta$ coordinate converter at the inputs of which voltage signals ($U_a$, $U_b$, $U_c$) allocated to the three phases of the supply system are present and the output of which for a direct coordinate acts via a low-pass filter and a first band-stop filter on a first output of the digital processing unit and the output of which for a quadratic coordinate acts via a second low-pass filter on a second output of the digital processing unit.

8. A digital measuring instrument as claimed in claim 4, wherein for determining a negative-sequence component ($I_-$), the frequency shifting block is formed by an R,S,T/qd coordinate converter at the inputs of which digitized current signals from said analog/digital converter allocated to respective phases of a three-phase supply system are present and signals allocated to a cosine and a sine of a time-variable angle between an R,S,T system and a qd system of coordinates and the output of which for a quadratic coordinate acts via a first low-pass filter and a first band-stop filter of the filter arrangement on a first multiplier constructed as a squaring unit and the output of which for a direct coordinate acts via a second low-pass filter and a second band-stop filter of the filter arrangement on a second multiplier constructed as a squaring unit, and the outputs of the first and of the second multiplier are in each case connected to an input of a summing unit the output of which is connected to the input of a root extractor.

9. A digital measuring instrument as claimed in claim 4, wherein, for determining a zero-sequence component ($I_o$), the frequency shifting block is formed by a circuit arrangement with a summing unit with constant factor multiplication, a first and a second multiplier constructed in each case as a squaring unit, a delay section with a time delay of ¼ of a period ($T_1$) of the supply system and a summing unit, in which digitized signals allocated to phase currents of the supply system are supplied to the input of the summing unit with constant factor multiplication, the output of the summing unit with constant factor multiplication is connected, on the one hand, to the input of the first multiplier and, on the other hand, acts via the delay section on the input of the second multiplier and in which the outputs of the first and second multiplier act on the summing unit.

10. A digital measuring instrument as claimed in claim 4, wherein, for determining a root mean square value of a current or of a voltage of a phase of the supply system, the frequency shifting block is formed by a multiplier which acts as squaring unit and at the input of which digitized values from said analog/digital converter of the current or of the voltage are present, and an averaging unit the input of which is connected to the output of the multiplier and the output of which acts via the filter arrangement on the input of a root extractor of the processing unit.

11. A digital measuring instrument as claimed in claim 10, wherein, for determining total harmonic distortion ($D_c$), the signals present at the inputs of the root extractor are supplied to one of two inputs of a divider the output of which is connected to the input of a summing unit with constant factor multiplication.

12. A digital measuring instrument as claimed in claim 4, wherein the frequency shifting block is constructed as a phase-locked loop for determination of a system frequency ($\omega$) of the supply system.

13. A digital measuring instrument as claimed in claim 12, wherein the phase-locked loop, as phase detector, includes an R,S,T/dq coordinate converter at the inputs of which signals allocated to three phases of the supply system are present and output signals of a signal generator acting as a VCO and the output of which for a quadratic coordinate is supplied to the input of a PI controller acting as a loop filter, the output of said PI controller being connected, on the one hand, to the input of the low-pass filter of the filter arrangement and, on the other hand, to a first input of a summing unit acting on the signal generator, at the second input of which a signal proportional to a nominal angular frequency ($\omega_1$) of the supply system is present.

14. A digital measuring instrument as claimed in claim 4, wherein, for determining a positive-sequence component ($I_+$), the frequency shifting block is formed by an R,S,T/dq coordinate converter at the inputs of which digitized current signals from said analog/digital converter allocated to respective phases of a three-phase supply system are present and signals allocated to a sine and a cosine of a time-variable angle between an R,S,T system and a dq system of coordinates and the output of which for a direct coordinate acts via a first low-pass filter and a first band-stop filter of the filter arrangement on a first multiplier constructed as a squaring unit and the output of which for a quadratic coordinate acts via a second low-pass filter and a second band-stop filter of the filter arrangement on a second multiplier constructed as a squaring unit and the outputs of the first and second multiplier are each connected to an input of a summing unit the output of which is connected to the input of a root extractor.

15. A digital measuring instrument as claimed in claim 14, wherein, for determining a ratio of imbalance $(I_-/I_+)$, the outputs of the root extractor are in each case connected to one of two inputs of a divider.

* * * * *